(12) United States Patent
Alapati et al.

(10) Patent No.: US 8,207,570 B2
(45) Date of Patent: Jun. 26, 2012

(54) SEMICONDUCTOR CONSTRUCTIONS

(75) Inventors: Ramakanth Alapati, Boise, ID (US); Ardavan Niroomand, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 12/851,896

(22) Filed: Aug. 6, 2010

(65) Prior Publication Data

US 2010/0295114 A1 Nov. 25, 2010

Related U.S. Application Data

(62) Division of application No. 11/714,378, filed on Mar. 5, 2007, now Pat. No. 7,790,360.

(51) Int. Cl.
*H01L 29/788* (2006.01)

(52) U.S. Cl. .......................... 257/315; 430/12

(58) Field of Classification Search .................. 257/315; 430/12
See application file for complete search history.

(56) References Cited

U.S. PATENT DOCUMENTS

| | | | |
|---|---|---|---|
| 3,240,684 | A | 3/1966 | Martin et al. |
| 6,063,688 | A | 5/2000 | Doyle et al. |
| 6,417,086 | B1 | 7/2002 | Osari |
| 6,432,813 | B1* | 8/2002 | Sandhu et al. ............... 438/622 |
| 6,475,891 | B2 | 11/2002 | Moon |
| 7,572,572 | B2 | 8/2009 | Wells |
| 7,648,919 | B2 | 1/2010 | Tran et al. |
| 7,651,951 | B2 | 1/2010 | Tran et al. |
| 2002/0055235 | A1* | 5/2002 | Agarwal et al. ............... 438/430 |
| 2006/0008981 | A1 | 1/2006 | Wang et al. |
| 2006/0234165 | A1 | 10/2006 | Kamigaki et al. |
| 2006/0240361 | A1 | 10/2006 | Lee et al. |
| 2006/0246655 | A1* | 11/2006 | Sandhu et al. ............... 438/240 |
| 2007/0049030 | A1* | 3/2007 | Sandhu et al. ............... 438/689 |
| 2007/0161251 | A1* | 7/2007 | Tran et al. .................. 438/725 |
| 2007/0238053 | A1 | 10/2007 | Hashimoto |
| 2008/0008969 | A1 | 1/2008 | Zhou et al. |
| 2008/0081412 | A1 | 4/2008 | Jung |
| 2008/0169496 | A1* | 7/2008 | Keller et al. .................. 257/314 |
| 2009/0098700 | A1 | 4/2009 | Yang |
| 2009/0305166 | A1 | 12/2009 | Shiobara et al. |
| 2010/0092890 | A1 | 4/2010 | Sandhu et al. |

FOREIGN PATENT DOCUMENTS

| | | |
|---|---|---|
| JP | 2000243937 A | 9/2000 |
| JP | 2003124339 A | 4/2003 |
| JP | 2006303022 A | 11/2006 |

OTHER PUBLICATIONS

PCT/US08/002012, PC, Feb. 7, 2008, International Search Report.
PCT/US08/002012, PC, Feb. 7, 2008, Written Opinion.
PCT/US08/002012, PC, Sep. 8, 2009, IPRP.

* cited by examiner

*Primary Examiner* — N Drew Richards
*Assistant Examiner* — Grant Withers
(74) *Attorney, Agent, or Firm* — Wells St. John P.S.

(57) ABSTRACT

Some embodiments include formation of polymer spacers along sacrificial material, removal of the sacrificial material, and utilization of the polymer spacers as masks during fabrication of integrated circuitry. The polymer spacer masks may, for example, be utilized to pattern flash gates of a flash memory array. In some embodiments, the polymer is simultaneously formed across large sacrificial structures and small sacrificial structures. The polymer is thicker across the large sacrificial structures than across the small sacrificial structures, and such difference in thickness is utilized to fabricate high density structures and low-density structures with a single photomask.

20 Claims, 12 Drawing Sheets

SEMICONDUCTOR CONSTRUCTIONS

RELATED PATENT DATA

This patent resulted from a divisional of U.S. patent application Ser. No. 11/714,378, which was filed Mar. 5, 2007, and which is hereby incorporated herein by reference.

TECHNICAL FIELD

Semiconductor constructions, methods of forming multiple lines, and methods of forming high density structures and low density structures with a single photomask.

BACKGROUND

Fabrication of integrated circuitry frequently utilizes photolithography to define structures. Specifically, radiation is passed through a photomask to pattern the radiation into light and shadow regions. The patterned radiation is utilized to impart an exposure pattern to photosensitive material (photoresist). The photoresist is then subjected to a developing solution. The developing solution selectively removes regions of the resist exposed to light relative to regions exposed to shadow, or vice versa (depending on whether the photoresist is a positive resist or a negative resist), and thus transforms the exposure pattern into a physical pattern formed in the photoresist.

It is noted that photomasks may alternatively be referred to as reticles. Historically, there has been some distinction between the terms photomask and reticle (with the term photomask referring to masks that form a pattern extending across an entirety of the substrate, and the term reticle referring to masks that form a pattern extending only partially across a substrate), but the distinction has become blurred in modern usage of the terms. Accordingly, the terms photomask and reticle are utilized interchangeably in this disclosure to refer to masks that may form patterns extending across an entirety of substrate, or across only a portion of a substrate.

Integrated circuitry may comprise multiple levels of structures stacked over a semiconductor substrate. The integrated circuitry may also comprise a variety of different structures formed within each level. Numerous photomasks may be utilized to create the different structures within a level, and to create the different levels. There is a risk of mask misalignment every time a new photomask is introduced into a fabrication sequence. Also, there is process time associated with each photomask which slows overall throughput of a fabrication process.

A continuing goal of semiconductor fabrication is to reduce photomasking steps in order to avoid mask misalignment and improve throughput.

Another aspect of the prior art is that non-volatile devices (flash) may be utilized in numerous memory and logic applications of integrated circuits. The term "flash" historically referred to particular non-volatile devices programmed with flashes of radiation. The term has become generic for any non-volatile structure utilizing a control gate and a floating gate, and will be utilized with such generic meaning throughout this disclosure.

It is desired to develop improved methods for forming flash, and for such methods to utilize only one photomasking step for patterning of multiple different structures.

DETAILED DESCRIPTION OF THE ILLUSTRATED EMBODIMENTS

In some embodiments, polymer spacers are formed along sacrificial material, and the sacrificial material is then removed to leave the spacers as double pitch masks for patterning one or more underlying materials. In some embodiments, the sacrificial material is provided as narrow blocks and wide blocks, and the polymer is formed to be thicker over the wide blocks than over the narrow blocks. Such difference in thickness of the polymer is utilized to simultaneously form double pitch patterns from the polymer spacers along the narrow blocks and single pitch patterns from the polymer along the wide blocks.

An example embodiment is described with reference to FIGS. 1-10.

Figure 1:
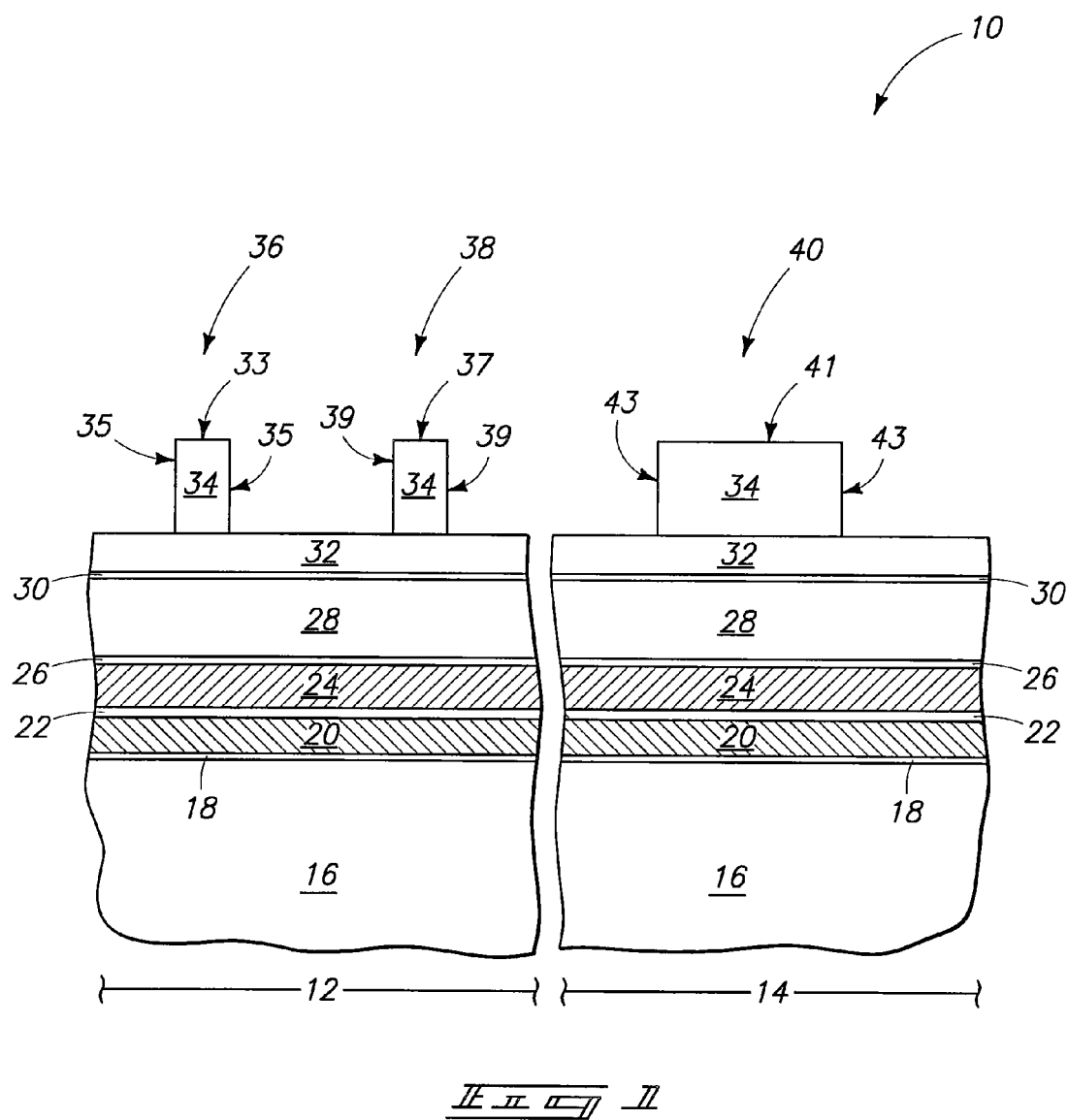
FIG. 1 is a diagrammatic cross-sectional view of a pair of portions of a semiconductor wafer at a processing stage of an embodiment.

Referring to FIG. 1, portions of a semiconductor wafer 10 are illustrated. The portions are labeled 12 and 14. Portion 12 may correspond to a memory array region, and specifically may correspond to a region where densely packed memory structures are to be fabricated. Portion 14 may correspond to a region peripheral to the memory array region, and may correspond to a region where logic circuitry and/or sensor circuitry is to be fabricated. The circuitry fabricated within portion 14 may be less densely packed than the memory circuitry fabricated within portion 12.

Wafer 10 comprises a semiconductor base 16 which may, for example, comprise, consist essentially of, or consist of monocrystalline silicon. To aid in interpretation of the claims that follow, the terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 16 is shown to be homogenous, in other embodiments the base may comprise numerous layers. For instance, base 16 may correspond to a semiconductor substrate containing one or more layers associated with integrated circuit fabrication. In such embodiments, the layers may correspond to one or more of metal interconnect layers, barrier layers, diffusion layers, insulator layers, etc.

Gate dielectric 18 extends across base 16. Gate dielectric 18 is shown as a single homogeneous layer, but in other embodiments may comprise multiple layers. Gate dielectric 18 may, for example, comprise, consist essentially of, or consist of silicon dioxide.

Electrically conductive floating gate material 20 extends across gate dielectric 18. Floating gate material 20 is shown as a single homogeneous layer, but in other embodiments may comprise multiple layers. Floating gate material 20 may, for example, comprise, consist essentially of, or consist of one or more of metal (for instance, tungsten, titanium, etc.), metal-containing compositions (for instance, metal silicide, metal nitride, etc.) and conductively-doped semiconductor material (for instance, conductively-doped silicon).

Intergate dielectric material 22 extends across floating gate material 20. Intergate dielectric material 22 is shown as a single homogeneous layer, but in other embodiments may comprise multiple layers. Intergate dielectric material 22 may, for example, comprise a layer of silicon nitride between a pair of layers of silicon dioxide (a so-called ONO stack).

Electrically conductive control gate material 24 extends across intergate dielectric material 22. Control gate material 24 is shown as a single homogeneous layer, but in other embodiments may comprise multiple layers. Control gate material 24 may, for example, comprise, consist essentially of, or consist of one or more of metal (for instance, tungsten, titanium, etc.), metal-containing compositions (for instance, metal silicide, metal nitride, etc.) and conductively-doped semiconductor material (for instance, conductively-doped silicon).

An electrically insulative cap material 26 extends across control gate material 24. Insulative cap material 26 is shown as a single homogeneous layer, but in other embodiments may comprise multiple layers. Insulative cap material 26 may, for example, comprise, consist essentially of, or consist of one or more of silicon dioxide, silicon nitride and silicon oxynitride.

A masking layer 28 extends across insulative cap material 26, and in the shown embodiment is in direct physical contact with an upper surface of the insulative cap material. Masking layer 28 may, for example, comprise, consist essentially of, or consist of carbon. For instance, masking layer 28 may consist of transparent carbon or amorphous carbon.

An etch stop 30 (which may also be referred to as a barrier) extends across masking layer 28. Etch stop 30 comprises a composition to which materials above etch stop 30 may be selectively etched. The etch stop may be omitted in some embodiments, such as if materials over masking layer 28 are of compositions that can be selectively etched relative to masking layer 28. In some embodiments, the etch stop may comprise, consist essentially of, or consist of silicon, silicon dioxide, or silicon nitride. If the etch stop comprises silicon dioxide, such may be formed by deposition from tetraethyl orthosilicate (TeOS).

A masking layer 32 extends across etch stop 30. Masking layer 32 may comprise an oxygen-containing material and/or a nitride-containing material. For instance, masking layer 32 may comprise, consist essentially of, or consist of silicon dioxide, silicon nitride or silicon oxynitride. Masking layer 32 may comprise a composition to which polymer (discussed below) may be selectively etched.

A masking material 34 is over masking layer 32. The masking material 34 is patterned into masking elements 36, 38 and 40. In the cross-sectional view of FIG. 1, masking elements 36 and 38 are narrower than masking element 40. Masking elements 36 and 38 may be considered to be examples of first masking elements, while masking element 40 is an example of a second masking element. In the shown embodiment, three masking elements are illustrated, with two of the masking elements being associated with the memory array region of portion 12 and one of the masking elements being associated with the peripheral region of portion 14. In other embodiments, more than one masking element may be associated with portion 14, and one element, or more than two elements, may be associated with portion 12. Also, one or more of the elements associated with portion 14 may be narrow, and one or more of the elements associated with portion 12 may be wide. However, the shown embodiment having narrow elements associated with portion 12 advantageously may form densely-packed elements of a memory array, as discussed in more detail below.

Masking material 34 may comprise any suitable material, and may, for example, comprise, consist essentially of, or consist of photoresist, silicon, or carbon. If material 34 comprises photoresist, it may be patterned into masking elements 36, 38 and 40 through photolithographic processing. Specifically, a layer of material 34 may be formed across masking material 32, exposed to radiation patterned with a photomask, and then developed to leave remaining elements 36, 38 and 40. If material 34 comprises silicon or carbon, it may be patterned by a first forming photolithographically patterned photoresist over the silicon or carbon, then transferring a pattern from the photoresist to the silicon or carbon with an etch, and finally removing the photoresist to leave elements 36, 38 and 40 of the silicon or carbon. Regardless of whether elements 36, 38 and 40 correspond to photolithographically patterned photoresist, or correspond to materials patterned by transferring a pattern from photolithographically patterned photoresist, elements 36, 38 and 40 may be considered to be patterned with a single photomasking step. Alternatively, elements 36 and 38 may be patterned in one step, and element 40 patterned in a different step.

Although masking material 34 is shown being patterned into elements over the peripheral region of portion 14 and the memory array region of portion 12, in other embodiments the masking material may be patterned into elements only over one of the portions 12 and 14. For example, masking material may be patterned into elements only over the memory array region, and pitch doubling procedures described below may be utilized to form highly integrated structures over the memory array region.

Various materials and layers of wafer 10 may be considered to together correspond to a semiconductor construction or assembly. For instance, base 16 together with layers and materials 18, 20, 22, 24, 26, 28, 30 and 32 may be considered to correspond to a semiconductor construction; and material 34 may be considered to be a patterned mask formed across such semiconductor construction. As another example, base 16 and materials and layers 18, 20, 22, 24 and 26 may be considered to correspond to a semiconductor assembly, and the remaining materials and layers may be considered to be formed over such assembly.

The materials 18, 20, 22, 24 and 26 of FIG. 1 may be patterned into flash gates (as described below). In other embodiments, other materials may be provided alternatively or additionally to materials 18, 20, 22, 24 and 26; and/or one or more of materials 18, 20, 22, 24 and 26 may be omitted. Also, although materials 18, 20, 22, 24 and 26 are shown extending across both of portions 12 and 14 of wafer 10, in other embodiments different materials may extend across portion 14 then extend across portion 12.

Masking materials 28, 32 and 34 may be referred to as first, second and third masking materials to distinguish them from one another.

Elements 36, 38 and 40 comprise top surfaces 33, 37 and 41, respectively; and comprise sidewall surfaces 35, 39 and 43, respectively. Elements 36 and 38 may have example widths in the shown cross section of about 50 nm, and may be spaced from one another by an example distance of about 150 nm.

Figure 2:
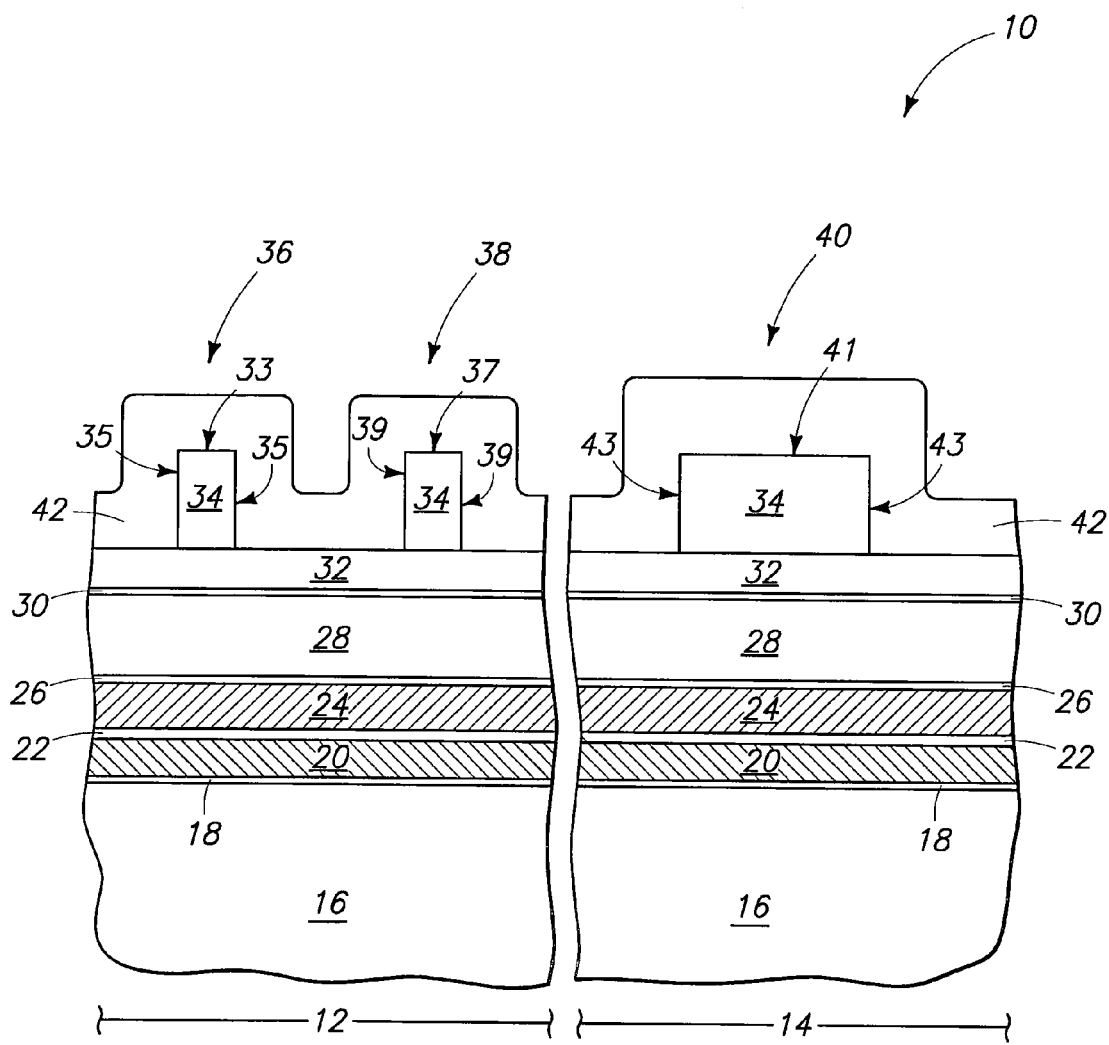
FIG. 2 is a view of the portions of FIG. 1 shown at a processing stage subsequent to that of FIG. 1.

Referring to FIG. 2, polymeric material 42 is formed over masking material 32, and across elements 36, 38 and 40. The polymeric material extends across the sidewall surfaces 35, 39 and 43 of elements 36, 38 and 40, and also extends over top surfaces 33, 37 and 41 of the elements. The polymeric material is formed to be thicker over wide element 40 then over narrow elements 36 and 38. In some embodiments, such difference in thickness results from the deposition conditions utilized to form the polymeric material, rather than resulting from processing steps in addition to the deposition. In some embodiments (discussed below), the difference in polymer thickness over element 40 relative to elements 36 and 38 is utilized to form a double pitch mask from elements 36 and 38, while forming a single pitch mask from element 40. In other embodiments, the single pitch mask may be formed with different masking than the double pitch mask, and the thickness of the polymeric material over the elements may be of less significance.

The deposition of polymeric material 42 may utilize a deposition and etch sequence within a processing chamber. The deposition part of the sequence may utilize one or more of $C_2H_4$, $CH_4$, and $CH_3R$ (where R is any carbon-containing material), etc. The deposition may be conducted with low-power (a power of from about 400 watts to about 800 watts), and high pressure (a pressure of at least about 200 millitorr). A radiofrequency (RF) applied within the chamber may be above 2 megahertz, and in some embodiments may be above 60 megahertz. The etch part of the sequence may be conducted with one or both of $CH_3F$ and $CF_4$. The etch may be conducted at low pressure (a pressure of less than or equal to 100 millitorr) and high power (a power of from about 1200 watts to about 1600 watts). An RF applied within the chamber during the etch may be from about 2 megahertz to about 30 megahertz. The deposition and etch of the sequence may be cycled until polymer 42 is formed to a desired thickness. The deposition and etch may form polymeric material 42 to comprise, consist essentially of, or consist of carbon and hydrogen; or to comprise, consist essentially of, or consist of carbon, hydrogen and fluorine.

Layer 42 may be formed to thickness of about 50 nm over and along elements 36 and 38.

Figure 3:
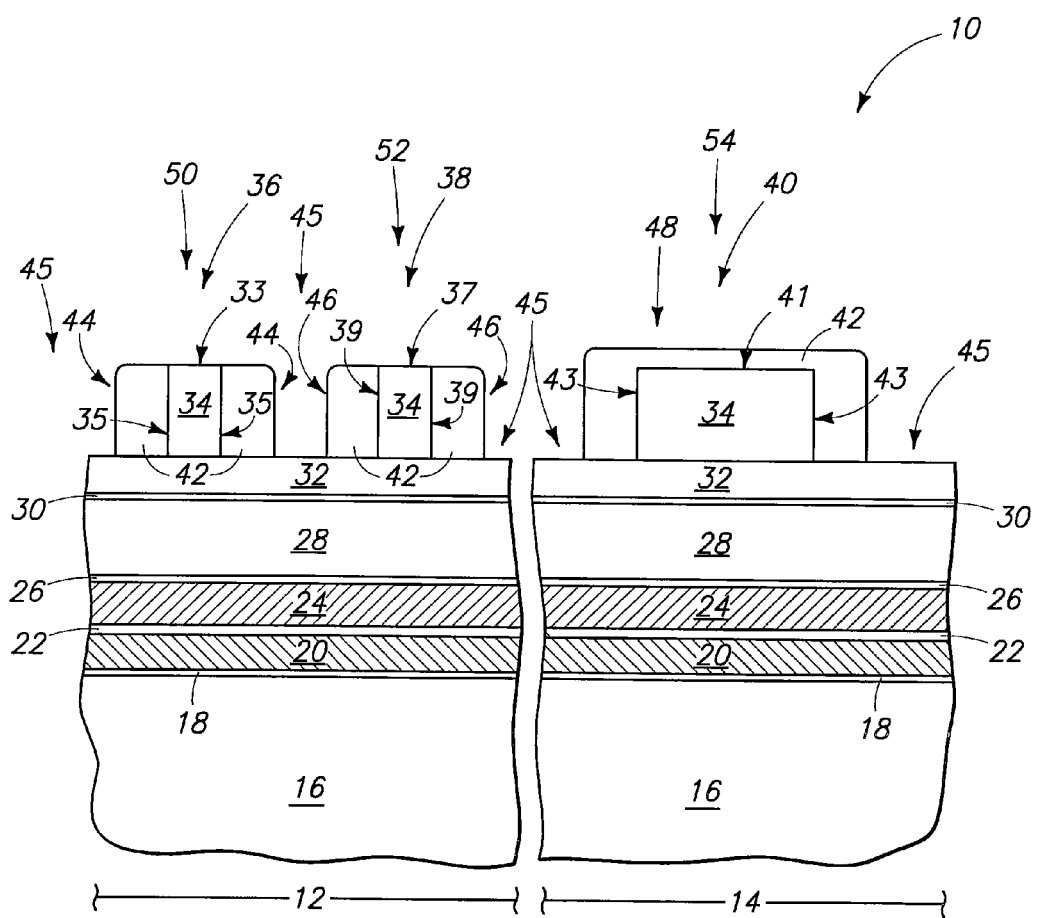
FIG. 3 is a view of the portions of FIG. 1 shown at a processing stage subsequent to that of FIG. 2.

Referring to FIG. 3, polymeric material 42 is anisotropically etched to form sidewall spacers 44 along sidewalls 35 of masking element 36, to form sidewall spacers 46 along sidewalls 39 of masking element 38, and to leave a shell 48 along the sidewalls 43 and top 41 of masking element 34. The etching also forms gaps 45 extending to material 32. In some embodiments, material 32 may be considered part of a semiconductor substrate, and accordingly the gaps may be considered to extend to the semiconductor substrate.

Portions of shell 48 along sidewalls 43 may be considered to be sidewall spacers, while a portion of the shell over surface 41 may be considered a protective cap. As discussed above with reference to FIG. 2, polymeric material 42 was initially formed to be thicker over wider element 40 than over narrow elements 36 and 38. The anisotropic etching has been conducted for a duration which exposes surfaces 33 and 37 of the narrow masking elements 36 and 38, while leaving the protective cap over masking element 34. The anisotropic etching may be conducted utilizing the etching conditions from the sequence utilized to form polymeric material 42. Accordingly, the anisotropic etching may utilize one or both of $CH_3F$ and $CF_4$; may be conducted at a pressure of less than or equal to 100 millitorr; and with a power of from about 1200 watts to about 1600 watts while RF of from about 2 megahertz to about 30 megahertz is applied. The anisotropic etching may be a dry etch.

The elements 36, 38 and 40, together with the polymeric material 42, may be considered to correspond to three masking structures 50, 52 and 54. Such masking structures may be considered to comprise core material corresponding to material 34, and peripheral material corresponding to material 42. Thus, masking structure 50 comprises core material 34 and peripheral material corresponding to spacers 44; and masking structure 52 comprises core material 34 and peripheral material corresponding to spacers 46. Similarly, masking structure 54 comprises core material 34 and a peripheral material corresponding to the shell 48 extending along the top and sidewalls of the core material.

The masking structures 50 and 52 may be considered to be narrow masking structures, while the masking structure 54 may be considered to be a wide masking structure. The wide masking structure may be at least twice as wide as the narrow masking structures. The narrow masking structures may be considered part of a first group corresponding to all narrow masking structures, while the wide masking structure may be considered to be part of a second group corresponding to all wide masking structures. Accordingly, the narrow masking structures may be considered to be representative of a group corresponding to first masking structures, while the wide masking structure is representative of a group corresponding to second masking structures. The peripheral and core materials of the first masking structures may be referred to as first peripheral and core materials, while the peripheral and core materials of the second masking structures may be referred to as second peripheral and core materials. The first peripheral materials do not extend across the tops of the first core materials (as shown in the representative first masking structures 50 and 52), while the second peripheral materials do extend across the tops of the second core materials (as shown in the representative second masking structure 54).

Figure 4:
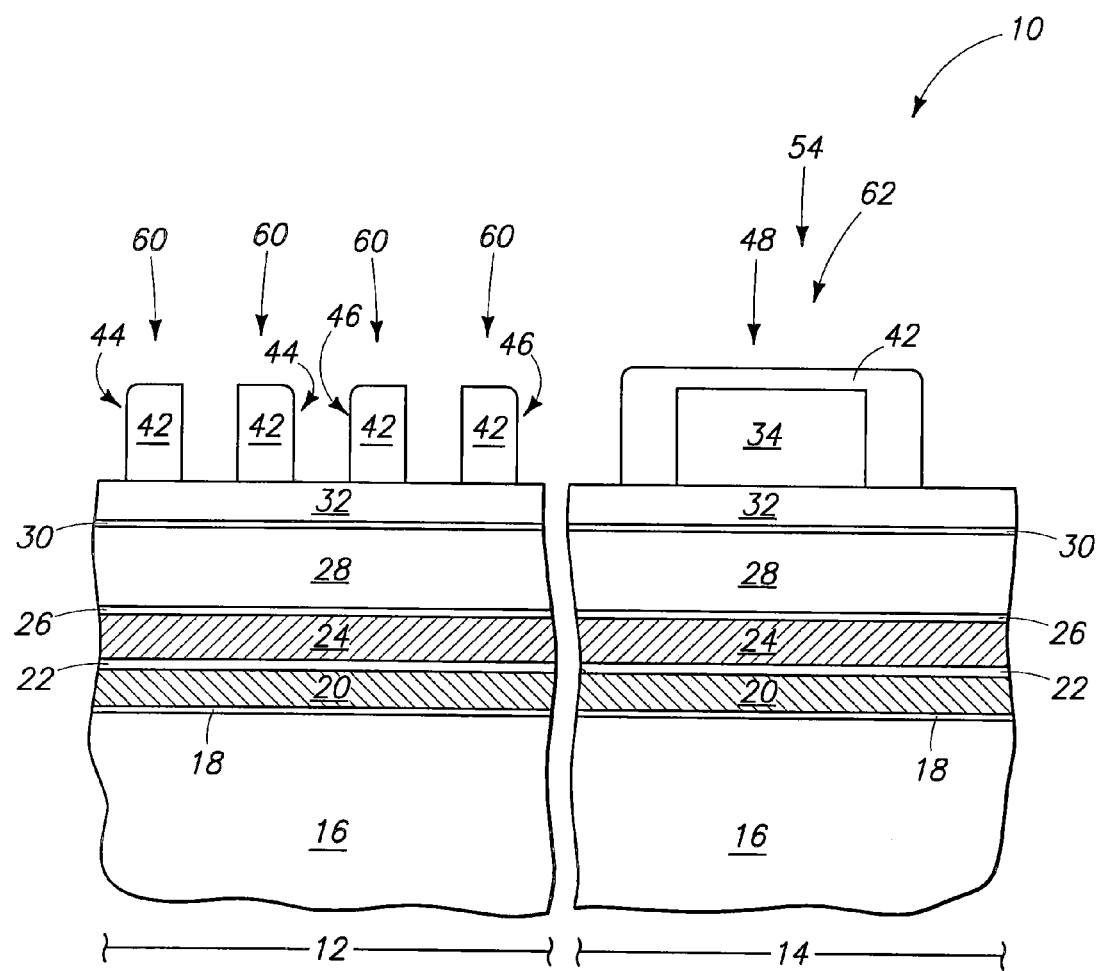
FIG. 4 is a view of the portions of FIG. 1 shown at a processing stage subsequent to that of FIG. 3.

Referring to FIG. 4, exposed material 34 of structures 50 and 52 (FIG. 3) is removed to leave spacers 44 and 46 remaining as spaced apart narrow masks 60. Material 34 and shell 48 of structure 54 remain as a wide mask 62. The narrow masks and wide mask may be utilized to pattern lines in materials underlying the masks, and may accordingly be referred to as narrow line patterns and a wide line pattern, respectively. The narrow masks 60 correspond to a double pitch pattern relative to the pitch of the masking elements 36 and 38 (FIG. 1) utilized to generate the masks, and the wide mask 60 corresponds to a single pitch pattern relative to the pitch of the masking element 40 (FIG. 1) utilized to generate the mask. Accordingly, narrow masks 60 may be considered to correspond to high density structure patterns, while the wide mask 62 may be considered to correspond to a low-density structure, with the terms "low-density" and "high density" being utilized relative to one another to indicate that structures pattern with masks 60 are formed to higher density than structures pattern with mask 62. In some embodiments, masks 60 may be considered to correspond to a first structure pattern, while mask 62 corresponds to a second structure pattern.

Material 34 is removed from between spacers 44 and 46 with conditions selective for material 34 relative to polymeric material 42, and which may also be selective for material 34 relative to material 32. The term "selective" means that the conditions remove material 34 at a faster rate than material 42, which can include, but is not limited to, conditions which are 100 percent selective for material 34 relative to material 42. In embodiments in which material 34 comprises photoresist, the material 34 may be removed with a developing solution and/or with an etch. In some embodiments the removal of the photoresist may be accomplished by a first blanket exposure to radiation followed by exposure to developer; a selective dry etch with $O_2$-based chemistry, and a solvent-based wet etch to remove resist selectively relative to polymeric material 42.

The conditions utilized to remove material 34 from structures 50 and 52 (FIG. 3) do not remove the material from structure 54 due to the protective cap extending across and protecting material of structure 34 from such conditions.

The structure of FIG. 4 may be considered to comprise a semiconductor substrate corresponding to base 16 together with materials and layers 18, 20, 22, 24, 26, 28, 30 and 32; and to comprise masking structures 60 and 62 over the substrate. Masking structures 60 may be considered to be first masking structures consisting essentially of, or consisting of, a first composition corresponding to polymer 42. Masking structure 62 may be considered to be a second masking structure comprising a second composition core corresponding to the composition of material 34, and also comprising a first composition shell around the second composition core. The second masking structure has a width which is at least twice the width of the first masking structures in the shown cross-sectional view, and may have a width at least three times that of the first masking structures, at least four times that of the first masking structures, etc. The larger the ratio of the width of the second masking structure to the first masking structure, the greater the difference in integrated circuit density that can be achieved in devices patterned with the first masking structures relative to devices patterned with the second masking structures. The first mask structures may be considered to have a pitch that is doubled relative to a pitch of the second masking structure.

Figure 5:
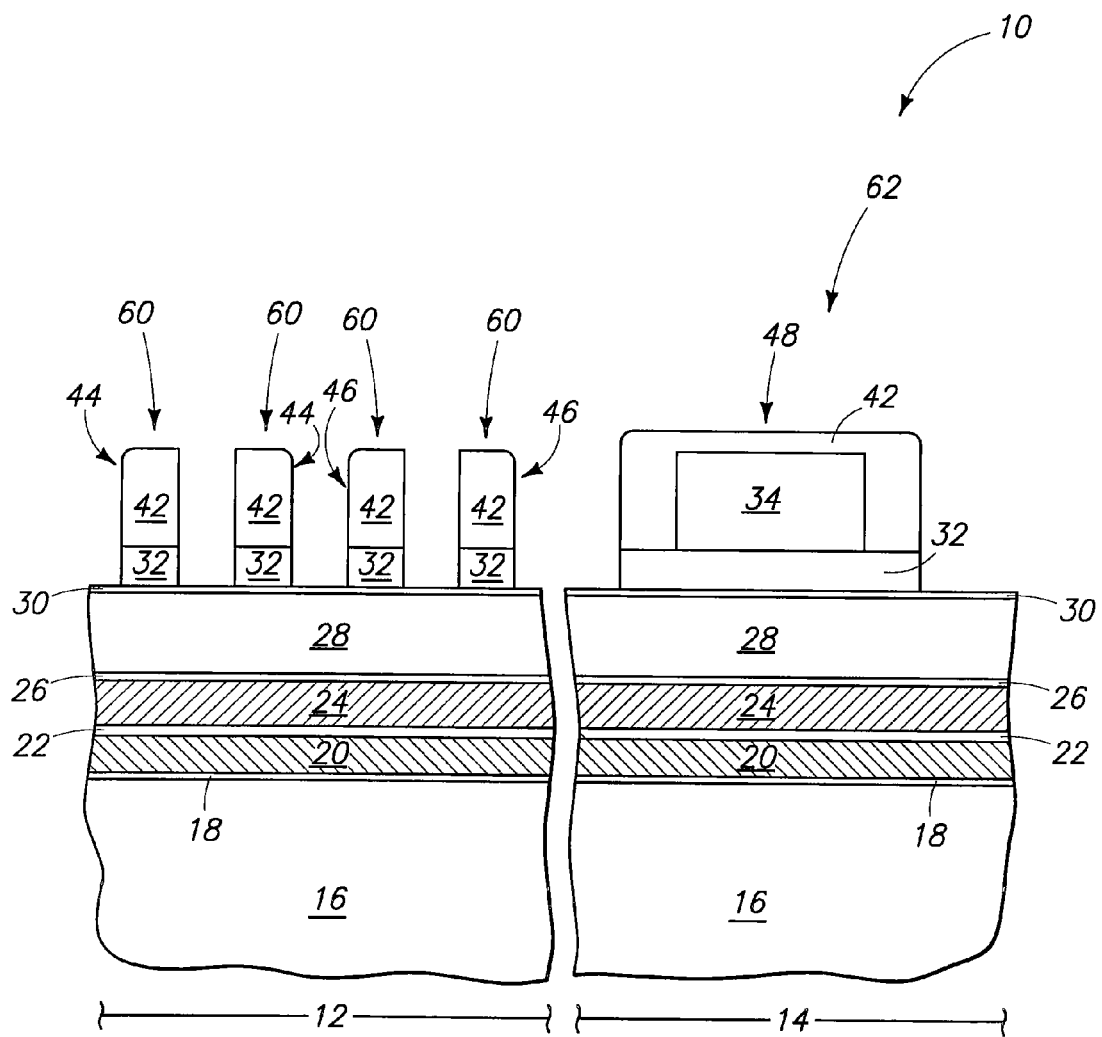
FIG. 5 is a view of the portions of FIG. 1 shown at a processing stage subsequent to that of FIG. 4.

Referring to FIG. 5, the narrow and wide line patterns 60 and 62 are transferred to masking material 32 with an etch. Such etch may be selective for material 32 relative to etch stop 30. In some embodiments, material 32 may comprise, consist essentially of, or consist of silicon nitride or silicon oxynitride, and the etch stop may consist essentially of, or consist of silicon or silicon dioxide. In other embodiments, material 32 may comprise, consist essentially of, or consist of silicon dioxide and the etch stop may consist essentially of, or consist of silicon. The etch into material 32 will be selective for material 32 relative to material 42, but may have low enough selectivity so that an appreciable amount of material 42 is removed. If material 32 comprises $SiO_2$, silicon oxynitride or silicon nitride, the etch may utilize $CH_3F$, $CF_4$ and/or $CH_2F_2$; and if material 32 consists of silicon, the etch may utilize $HBr/Cl_2$.

A pattern is considered to be transferred from a mask to underlying materials when a substantially anisotropic etch is utilized to etch the underlying materials while the mask is in place. If the etch is purely anisotropic, the underlying materials will be patterned into features having widths identical to the widths of masking structures above the features (within tolerances of etching procedures). If the etch is predominately anisotropic, the underlying materials will be patterned into features having widths approximate to the widths of masking structures above the features.

Figure 6:
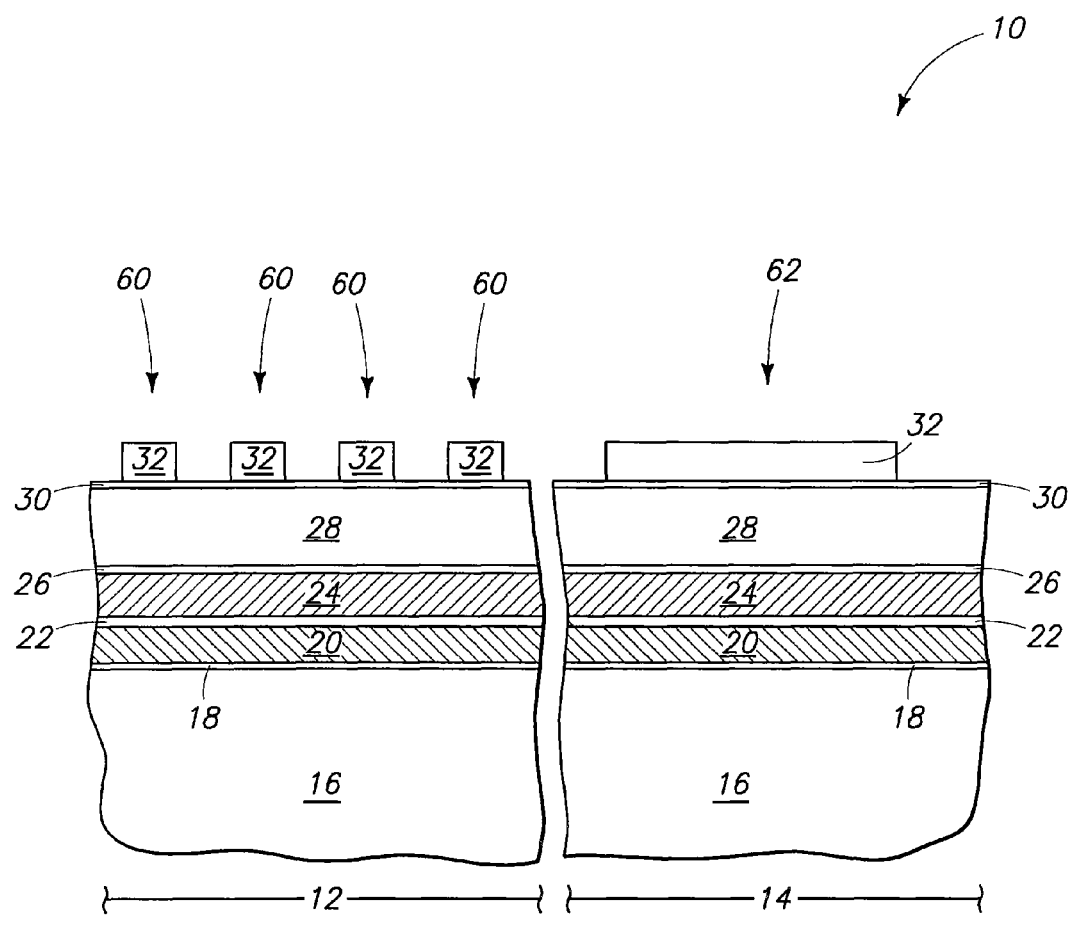
FIG. 6 is a view of the portions of FIG. 1 shown at a processing stage subsequent to that of FIG. 5.

Referring to FIG. 6, materials 34 and 42 (FIG. 5) are removed to leave narrow and wide line patterns 60 and 62 comprising only material 32. If material 34 is photoresist or carbon, and material 42 is organic polymer, the removal of materials 34 and 42 may be accomplished with exposure to $O_2$, utilizing a process commonly referred to as ashing. In some embodiments, one or both materials 34 and 42 is not removed, but instead remains as part of narrow and wide masks 60 and 62 during subsequent processing. For instance, if material 34 comprises silicon it may remain as part of the wide line patterns.

Figure 7:
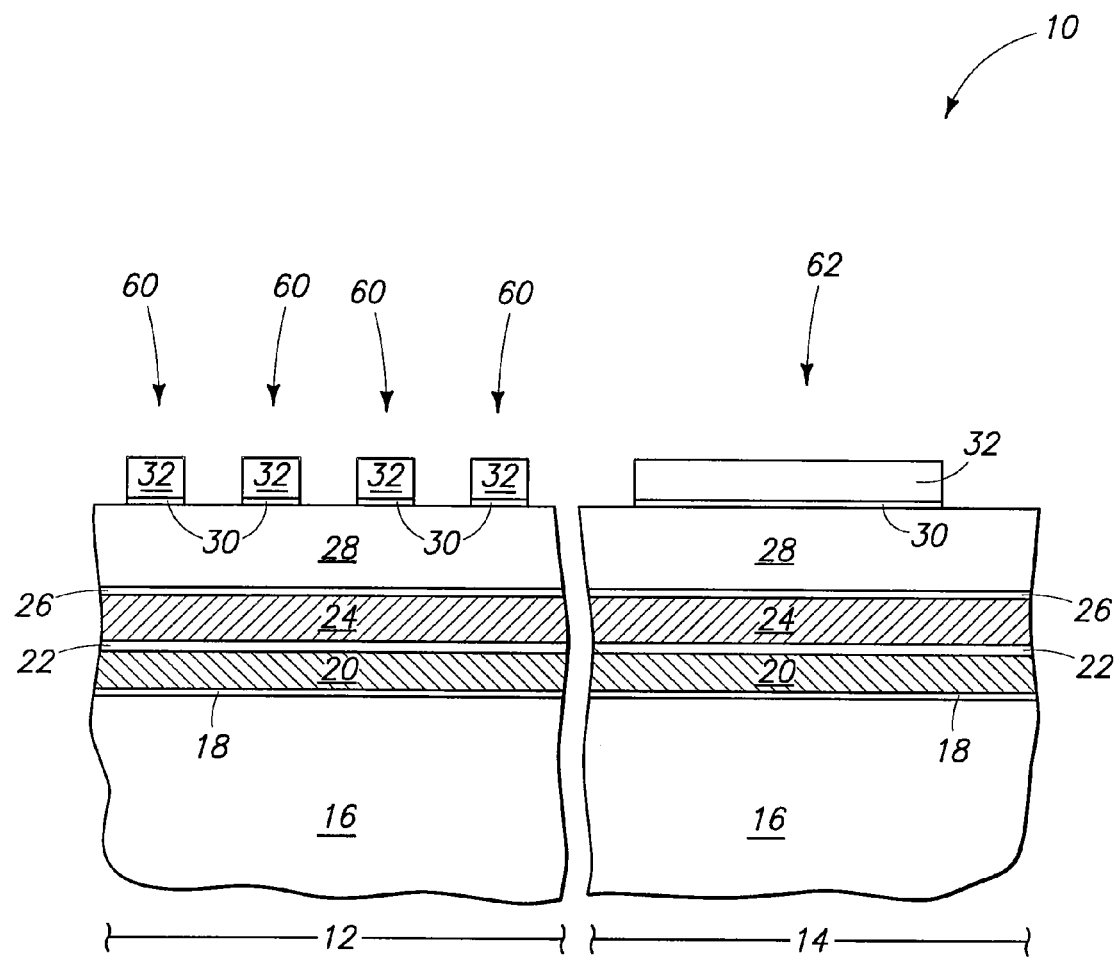
FIG. 7 is a view of the portions of FIG. 1 shown at a processing stage subsequent to that of FIG. 6.

Referring to FIG. 7, narrow and wide line patterns 60 and 62 are transferred into barrier material 30 with an etch. If barrier material 30 consists of silicon, the etch may utilize $HBr/Cl_2$; and if the barrier material consists of silicon nitride, the etch may utilize $CH_3F/CF_4$.

Figure 8:
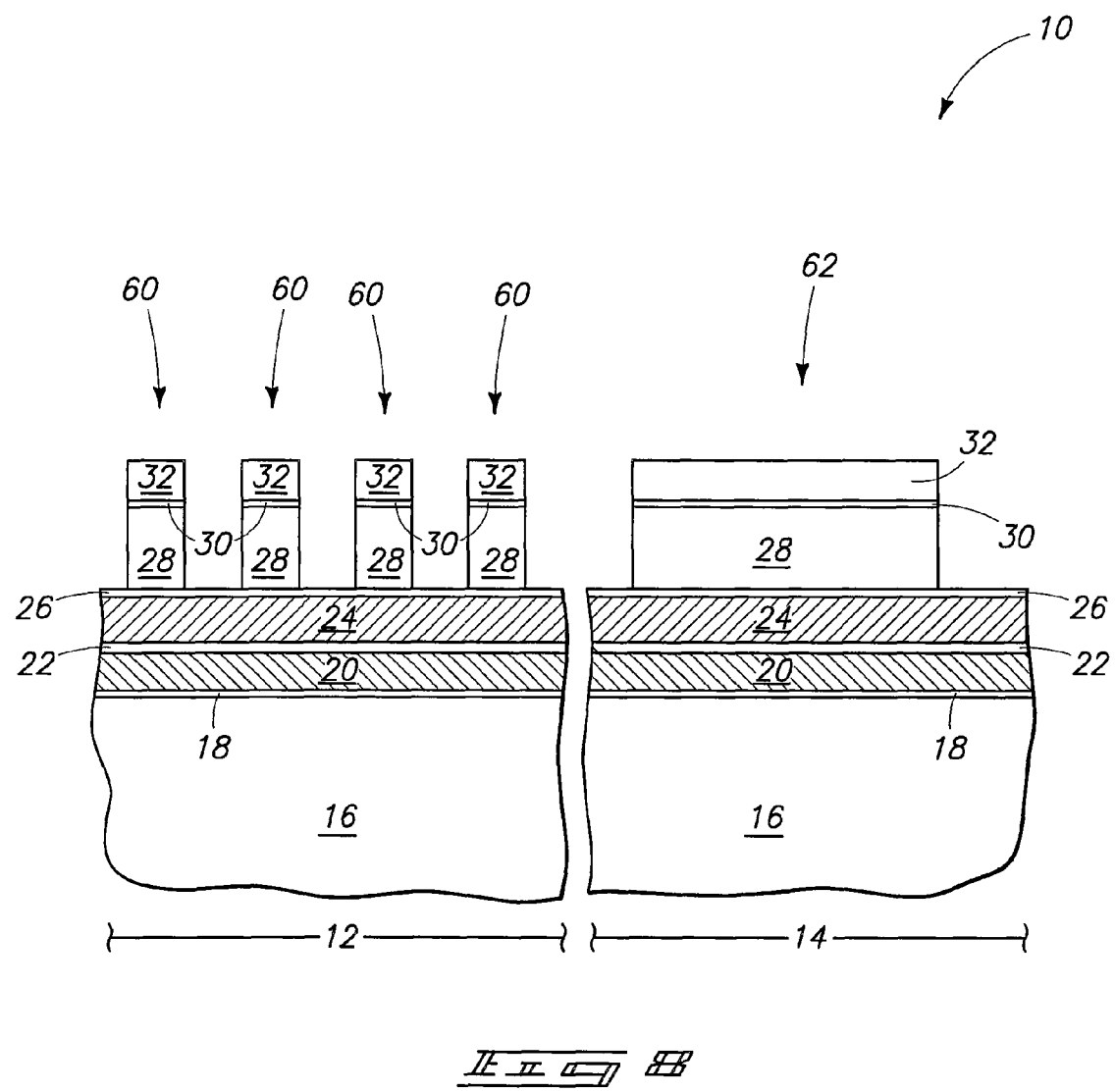
FIG. 8 is a view of the portions of FIG. 1 shown at a processing stage subsequent to that of FIG. 7.

Referring to FIG. 8, narrow and wide line patterns 60 and 62 are transferred into material 28 with an etch. If material 28 comprises transparent carbon, the etch may utilize one or more of $SO_2/O_2$, $HBr/O_2$ and $Cl_2/O_2$.

Figure 9:
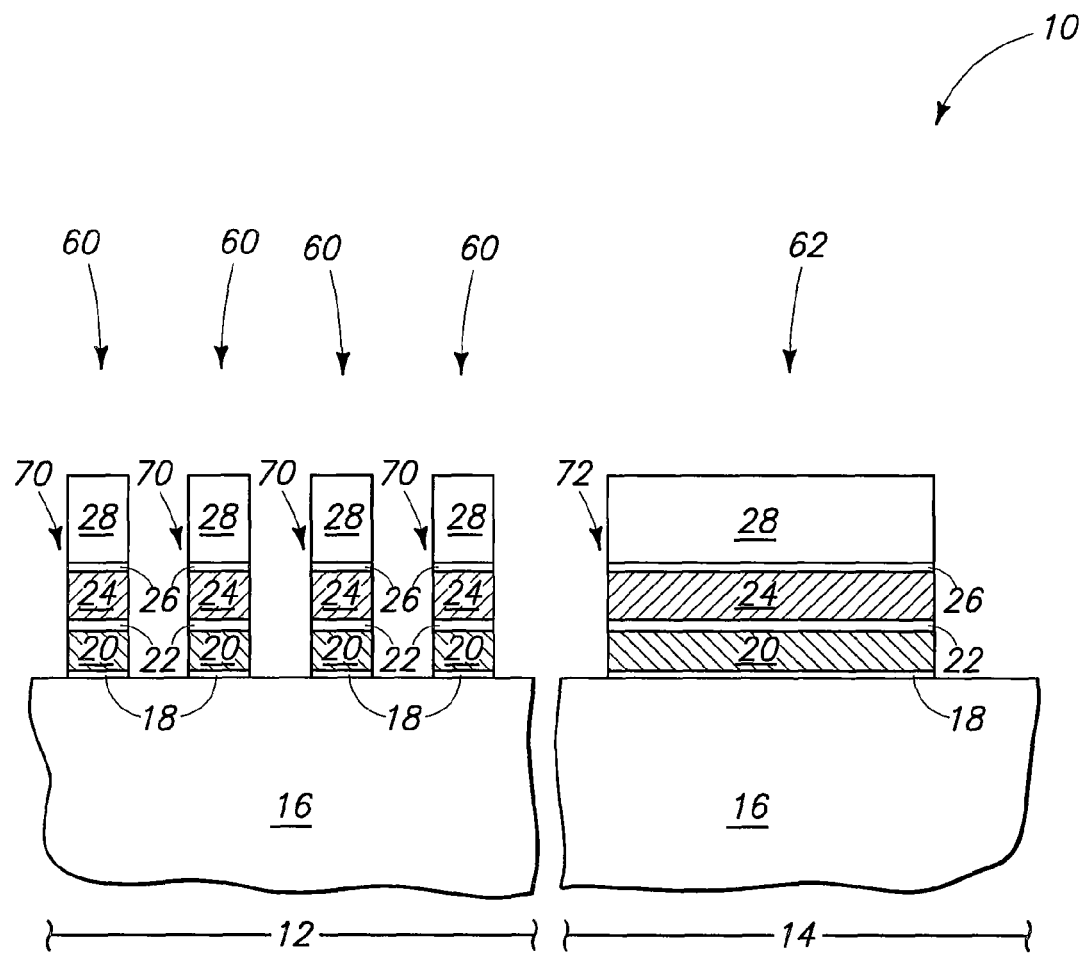
FIG. 9 is a view of the portions of FIG. 1 shown at a processing stage subsequent to that of FIG. 8.

Referring to FIG. 9, narrow and wide line patterns 60 and 62 are transferred into materials 18, 20, 22, 24 and 26 with one or more etches. The etching through 26 may utilize conditions which also remove materials 30 and 32 (FIG. 8) from over material 28. The materials 18, 20, 22 to 24 and 26 form a plurality of narrow, densely packed flash gate structures 70 within portion 12 of wafer 10, and form a wide flash gate structure 72 within portion 14 of wafer 10. The flash gate structures 70 have widths substantially identical to the widths of narrow line patterns 60 of material 28, while the flash gate structure 72 has a width substantially identical to the width of wide line pattern 62 of material 28. The widths of the flash gate structures may be within five percent of the widths of the overlying masking line patterns, and in some embodiments may be identical to the widths of the overlying masking line patterns.

Figure 10:
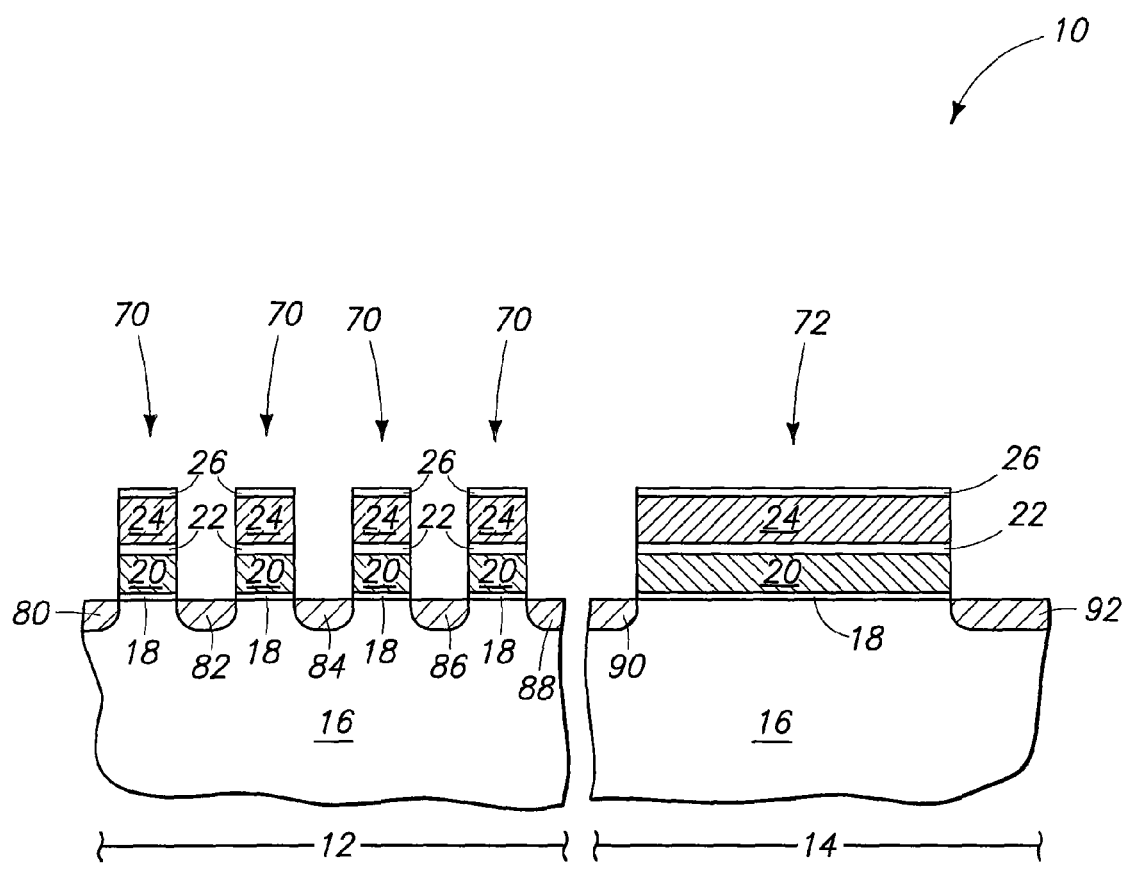
FIG. 10 is a view of the portions of FIG. 1 shown at a processing stage subsequent to that of FIG. 9.

Referring to FIG. 10, material 28 (FIG. 9) is removed to leave flash gate structures 70 and 72. Material 28 may be removed by exposure to $O_2$. Source/drain regions 80, 82, 84, 86, 88, 90 and 92 are shown formed adjacent the flash gate structures. The source/drain regions may be formed by implanting appropriate conductivity-enhancing dopant into semiconductor base 16.

The flash structures of FIG. 10 may be incorporated into electronic systems, and may, for example, be utilized in NAND or NOR cells.

Figure 11:
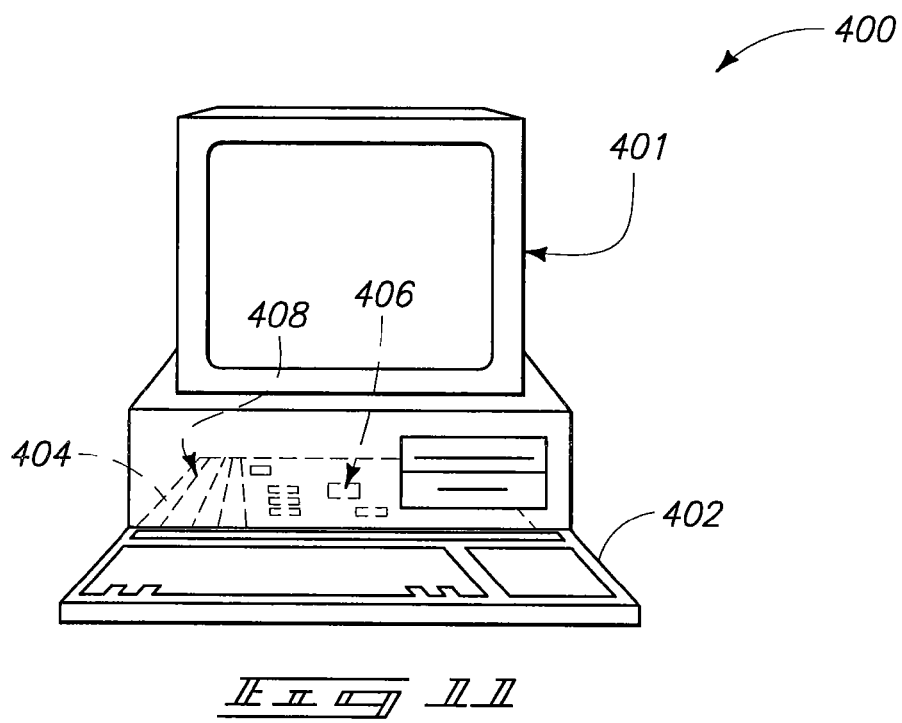
FIG. 11 is a diagrammatic view of a computer embodiment.
Figure 12:
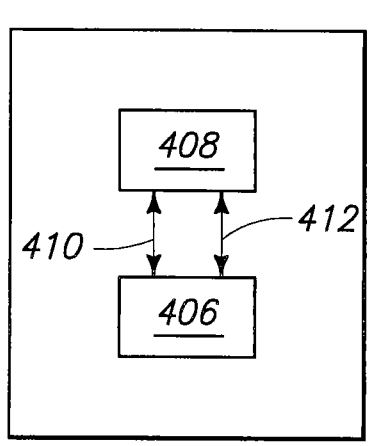
FIG. 12 is a block diagram showing particular features of the motherboard of the FIG. 11 computer embodiment.

FIG. 11 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 12. In such block diagram, the addressing circuitry is illustrated as 410 and the read circuitry is illustrated as 412.

Processor device 406 may correspond to a processor module, and associated memory utilized with the module may comprise flash structures.

Memory device 408 may correspond to a memory module, and may comprise flash memory.

Figure 13:
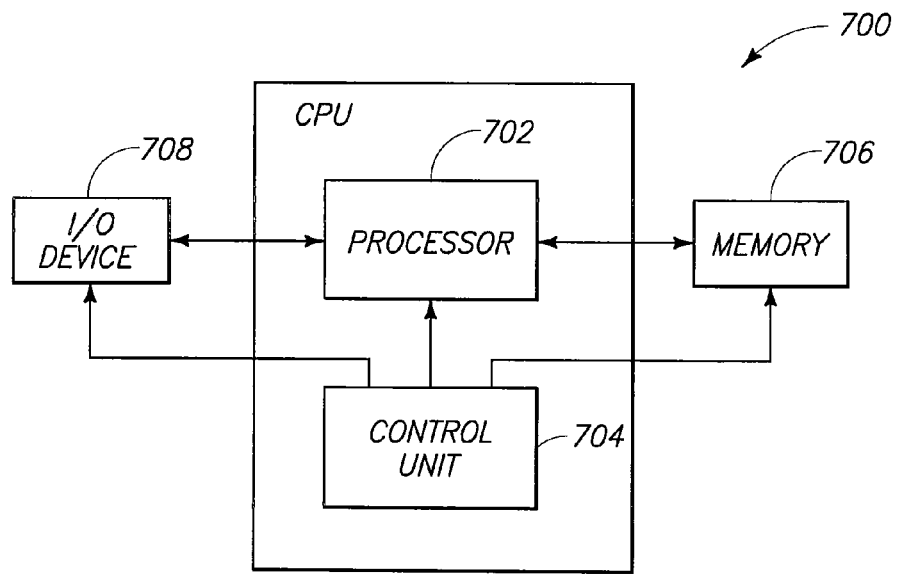
FIG. 13 is a high level block diagram of an electronic system embodiment.

FIG. 13 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include flash memory, such as a flash card.

Figure 14:
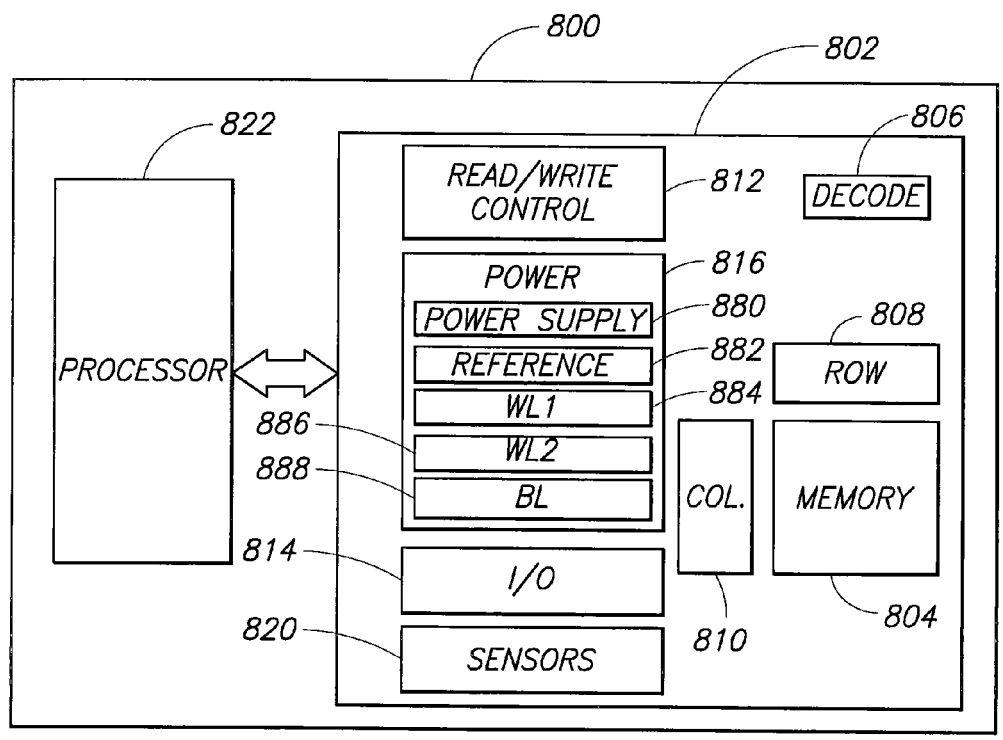
FIG. 14 is a simplified block diagram of a memory device embodiment.

FIG. 14 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include flash memory.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction, comprising:
 a patterned photoresist mask over a semiconductor substrate; the patterned mask comprising narrow masking elements and wide masking elements; the narrow masking elements and wide masking elements comprising sidewalls; and
 polymeric material over the substrate; the polymeric material being over the wide masking elements but not over the narrow masking elements; the polymeric material being along sidewalls of the narrow masking elements and along sidewalls of the wide masking elements; gaps extending through the polymeric material to the substrate.

2. The construction of claim 1 wherein the substrate comprises a monocrystalline base, and in ascending order from the base, gate dielectric, floating gate material, intergate dielectric, control gate material, carbon-containing material, and nitrogen-containing material.

3. The construction of claim 2 further comprising a barrier between the carbon-containing material and the nitrogen-containing material; the barrier consisting essentially of silicon or silicon dioxide.

4. The construction of claim 2 wherein the carbon-containing material consists of transparent carbon.

5. The construction of claim 2 wherein the nitrogen-containing material comprises silicon oxynitride.

6. The construction of claim 2 wherein the nitrogen-containing material comprises silicon nitride.

7. The construction of claim 1 wherein the substrate comprises a monocrystalline base, and in ascending order from the base, gate dielectric, floating gate material, intergate dielectric, control gate material, carbon-containing material, and silicon dioxide.

8. The construction of claim 7 further comprising a barrier between the carbon-containing material and the silicon dioxide; the barrier consisting essentially of silicon.

9. A semiconductor construction, comprising:
 a plurality of masking structures over a semiconductor substrate; the masking structures being spaced from one another by gaps extending to the substrate; at least two of the masking structures being first masking structures of a first composition; at least one of the masking structures being a second masking structure comprising a second composition core and a first composition shell around the core; the second composition being different from the first composition; in at least one cross-sectional view, the first masking structures being a first width and the second masking structure being a second width which is at least twice as large as the first width; and
 wherein the first composition comprises polymer and the second composition comprises photoresist.

10. A semiconductor construction, comprising:
 a plurality of masking structures over a semiconductor substrate; the masking structures being spaced from one another by gaps extending to the substrate; at least two of the masking structures being first masking structures of a first composition; at least one of the masking structures being a second masking structure comprising a second composition core and a first composition shell around the core; the second composition being different from the first composition; in at least one cross-sectional view, the first masking structures being a first width and the second masking structure being a second width which is at least twice as large as the first width; and
 wherein the first composition comprises polymer and the second composition consists of silicon.

11. A semiconductor construction, comprising:
a plurality of masking structures over a semiconductor substrate; the masking structures being spaced from one another by gaps extending to the substrate; at least two of the masking structures being first masking structures of a first composition; at least one of the masking structures being a second masking structure comprising a second composition core and a first composition shell around the core; the second composition being different from the first composition; in at least one cross-sectional view, the first masking structures being a first width and the second masking structure being a second width which is at least twice as large as the first width; and
wherein the first composition comprises polymer and the second composition consists of carbon.

12. A semiconductor construction, comprising:
a plurality of masking structures over a semiconductor substrate; the masking structures being spaced from one another by gaps extending to the substrate; at least two of the masking structures being first masking structures of a first composition; at least one of the masking structures being a second masking structure comprising a second composition core and a first composition shell around the core; the second composition being different from the first composition; in at least one cross-sectional view, the first masking structures being a first width and the second masking structure being a second width which is at least twice as large as the first width; and
wherein the substrate comprises a monocrystalline base, and in ascending order from the base, gate dielectric, floating gate material, intergate dielectric, control gate material, carbon-containing material, and nitrogen-containing material.

13. The construction of claim 12 further comprising a barrier between the carbon-containing material and the nitrogen-containing material; the barrier consisting essentially of silicon or silicon dioxide.

14. The construction of claim 12 wherein the carbon-containing material consists of transparent carbon.

15. The construction of claim 12 wherein the nitrogen-containing material comprises silicon oxynitride.

16. The construction of claim 12 wherein the nitrogen-containing material comprises silicon nitride.

17. A semiconductor construction, comprising:
a plurality of masking structures over a semiconductor substrate; the masking structures being spaced from one another by gaps extending to the substrate; at least two of the masking structures being first masking structures of a first composition; at least one of the masking structures being a second masking structure comprising a second composition core and a first composition shell around the core; the second composition being different from the first composition; in at least one cross-sectional view, the first masking structures being a first width and the second masking structure being a second width which is at least twice as large as the first width; and
wherein the substrate comprises a monocrystalline base, and in ascending order from the base, gate dielectric, floating gate material, intergate dielectric, control gate material, carbon-containing material, and silicon dioxide.

18. The construction of claim 17 further comprising a barrier between the carbon-containing material and the silicon dioxide; the barrier consisting essentially of silicon.

19. A semiconductor construction, comprising:
a monocrystalline base having a memory array region and another region peripheral to the memory array region;
a plurality of flash gate structures over the monocrystalline base, each of the individual gate structures comprising, in ascending order from the base, at least one gate dielectric layer, at least one floating gate layer, at least one intergate dielectric layer, and at least one control gate layer;
a patterned carbon-containing layer over the flash gate structures and having width dimensions substantially identical to those of the flash gate structures;
at least two of the flash gate structures being first flash gate structures having a first width; and
at least one of the flash gate structures being a second flash gate structure having a second width which is at least twice as large as the first width;
wherein the first flash structures are within the memory array region and are incorporated into densely packed memory structures; and
wherein the second flash structure is within the region peripheral to the memory array region and is incorporated into logic circuitry and/or sensor circuitry.

20. The construction of claim 19 wherein the carbon-containing layer consists of transparent carbon.

* * * * *